(12) United States Patent
Xia et al.

(10) Patent No.: US 9,921,949 B2
(45) Date of Patent: Mar. 20, 2018

(54) SOFTWARE TESTING

(71) Applicant: EMC Corporation, Hopkinton, MA (US)

(72) Inventors: Robert Guowu Xia, Shanghai (CN); Leo Hao Li, Shanghai (CN); Lin Wang, Shanghai (CN); Charles Chao Wang, Shanghai (CN); Jiayin Wang, Shanghai (CN); Wilber Li Tian, Shanghai (CN); Martin Xiaodong Yang, Shanghai (CN); David Weiwei Qian, Shanghai (CN)

(73) Assignee: EMC IP Holding Company, Hopkinton, MA (US)

( * ) Notice: Subject to any disclaimer, the term of this patent is extended or adjusted under 35 U.S.C. 154(b) by 0 days.

(21) Appl. No.: 14/968,399

(22) Filed: Dec. 14, 2015

(65) Prior Publication Data
US 2016/0188451 A1    Jun. 30, 2016

(30) Foreign Application Priority Data

Dec. 30, 2014  (CN) .......................... 2014 1 0854536

(51) Int. Cl.
*G06F 9/44* (2006.01)
*G06F 11/36* (2006.01)
*G06F 17/50* (2006.01)
*G06F 9/455* (2018.01)

(52) U.S. Cl.
CPC ............ *G06F 11/3688* (2013.01); *G06F 8/70* (2013.01); *G06F 17/5022* (2013.01); *G06F 2009/45579* (2013.01)

(58) Field of Classification Search
None
See application file for complete search history.

(56) References Cited

U.S. PATENT DOCUMENTS

| | | | | |
|---|---|---|---|---|
| 6,275,785 B1* | 8/2001 | Currie | .................... | G06F 9/54 703/13 |
| 2004/0237062 A1* | 11/2004 | Zeidman | ................. | G06F 9/455 717/100 |
| 2006/0161415 A1* | 7/2006 | Takahashi | ............. | G06F 11/261 703/21 |
| 2008/0021669 A1* | 1/2008 | Blancha | ............. | G01R 31/2834 702/122 |
| 2011/0246975 A1* | 10/2011 | Baudisson | .......... | G06F 9/45537 717/151 |
| 2012/0278660 A1* | 11/2012 | Mangold | ............. | G06F 11/3688 714/38.1 |
| 2013/0275945 A1* | 10/2013 | Kollberg | ............. | G06F 9/45558 717/124 |
| 2014/0304685 A1* | 10/2014 | Xie | ........................ | G06F 9/455 717/124 |

(Continued)

*Primary Examiner* — Chameli Das
(74) *Attorney, Agent, or Firm* — Krishnendu Gupta; Konrad R. Lee

(57) ABSTRACT

Embodiments of the present disclosure provide a method, a computer program product and a computing device for software test by wherein a computing device, wherein at least one virtual hardware component, each virtual hardware component simulating a behavior of a hardware component associated with a to-be-tested software, and testing the to-be-tested software based on the behavior simulated by the at least one virtual hardware component.

15 Claims, 4 Drawing Sheets

(56) References Cited

U.S. PATENT DOCUMENTS

2015/0339214 A1* 11/2015 Rozenman .......... G06F 11/3664
717/130
2016/0140022 A1* 5/2016 Michelsen ................ G06F 1/00
702/186

* cited by examiner even though pages

SOFTWARE TESTING

RELATED APPLICATION

This application claim priority from Chinese Patent Application Number CN201410854536.X, titled "METHOD AND COMPUTING DEVICE FOR SOFTWARE TEST" filed on Dec. 30, 2014 at the State Intellectual Property Office, China, the contents of which are herein incorporated by reference in its entirety.

TECHNICAL FIELD

Embodiments of the present disclosure relate to the field of computer.

BACKGROUND OF THE INVENTION

A product development process (e.g., a development process of various electronic devices and apparatuses) generally includes hardware development and software development. Hardware development typically involves selecting and assembling hardware components of a product, development and debugging of hardware functions, and the like, while software development typically involves development of software associated with hardware components, and tests of the developed software so as to adapt the hardware components.

SUMMARY

In view of the above and other potential problems, embodiments of the present disclosure provide a method, a computer program product and computing device for software test by providing at least one virtual hardware component by a computing device, each virtual hardware component simulating a behavior of a hardware component associated with to-be-tested software, and testing the to-be-tested software based on the behavior simulated by the at least one virtual hardware component.

BRIEF DESCRIPTION OF THE DRAWINGS

Through the more detailed description of exemplary embodiments of the present disclosure with reference to the accompanying drawings, the above and other objectives, features, and advantages of the present disclosure will become more apparent. In the exemplary embodiments of the present disclosure, the same reference numerals always refer to the same components.

DETAILED DESCRIPTION

Figure 1:
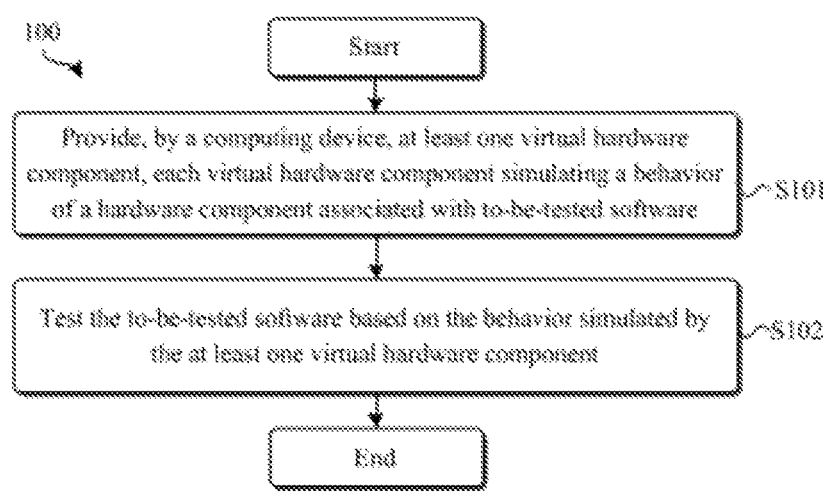
FIG. 1 shows an exemplary flowchart of a method for software test according to an embodiment of the present invention.

Some embodiments will be described in more details below with reference to the accompanying drawings. Although the drawings show embodiments of the present disclosure, it should be appreciated that the present disclosure may be implemented in various manners and thus should not be limited by the embodiments described herein. On the contrary, these embodiments are provided for thorough and complete understanding of the present disclosure, so as to completely convey the scope of the present disclosure to those skilled in the art.

In description of example embodiments, "includes" and its variants are to be read as open-ended terms that mean "includes, but is not limited to." The term "based on" is to be read as "based at least in part on." The terms "an embodiment" and "the embodiment" are to be read as "at least one embodiment."

Embodiments of the present disclosure will be described in detail below. It would be appreciated through the description below that embodiments of the present disclosure are related to provide a hardware simulation platform before the completion of hardware development. The platform may virtualize corresponding hardware components, such that software test may be executed based on a virtual hardware component without waiting for the completion of hardware development. Such software test method enables software development and hardware development to be executed in parallel, and enables different software to be tested for different hardware components to be tested in parallel, which facilitates the progress of software development and shortens the time consumed for product development. Moreover, because it is unnecessary to manufacture and deliver hardware boards for software testing purpose, it is a cost-effective manner. In addition, virtual hardware components may not only simulate normal behaviors of the hardware components, but also simulate error behaviors of hardware components, thereby effectively testing the processing capability of software errors and enhancing robustness of software.

Generally, in a conventional product development process, software development may depend on completion of hardware development. In one embodiment, for example, after an overall hardware development may have been completed, a hardware development department may transfer the produced hardware engineering board to the software department so that the software department may test the developed software on the hardware engineering board. In an alternate embodiment, after the hardware development completed at each stage (e.g., at the engineering verification testing (EVT) stage, at the critical design verification and testing (cDVT) stage, and the design verification and testing (DVT) stage) may be completed, the developed hardware engineering board may be delivered to the software department to perform software testing. Generally, different software developers or software development teams in the software department may develop multiple kinds of software associated with different hardware components and different software may need one or more hardware engineering boards for a test purpose.

In some embodiment, such a product development process may generally cause a higher time being spent and economic cost. In some other embodiments, since software development may depend on completion of hardware development, time consumed for completing a product development may be rather long. In some other embodiments, a large number of hardware engineering boards for software test may need to be manufactured, transferred, and maintained during use, which may increase economic cost associated with product development. In some other embodiments, if a hardware problem is found during a software test process, it may cause re-execution of the hardware development and re-production of the hardware engineering boards, which may increase both of the time cost and economic cost.

In view of the above and other potential problems, embodiments of the present disclosure may include a method, a computer program product and computing device for software testing by providing at least one virtual hardware component by a computing device. A further embodiment may include each virtual hardware component simulating a behavior of a hardware component associated with to-be-tested software. A further embodiment may include testing to-be-tested software based on a behavior simulated by at least one virtual hardware component. In one embodiment, a computing device may have at least a central processor and a memory.

One embodiment may include providing a virtual bus corresponding to at least one virtual hardware component by a computing device, such that at least one virtual hardware component may be connected to a central processor and a memory via the virtual bus. In one embodiment, the computing device may include an already developed hardware component that may be associated with the software. In one embodiment, a plurality of virtual hardware components may be provided by a computing device.

In one embodiment, testing software based on a behavior simulated by the virtual hardware component may include testing software in parallel based on behaviors simulated by a plurality of virtual hardware components. In one embodiment, simulated behavior of the hardware component may include at least one of a normal behavior and an error behavior of the hardware component.

According to one embodiment, there may be provided a computing device for software test. In a further embodiment, a computing device may include a virtual hardware component provision unit that may be configured to provide at least one virtual hardware component, and each virtual hardware component may simulate a behavior of a hardware component that may be associated with a to-be-tested software. In a further embodiment, a computing device may further include a software test unit configured to test a to-be-tested software based on a behavior simulated by the at least one virtual hardware component. In one embodiment, computing device may have at least a central processor and a memory.

In one embodiment, a computing device may further include a virtual bus provision unit that may be configured to provide a virtual bus corresponding to at least one virtual hardware component, such that the at least one virtual hardware component may be connected to the central processor and the memory via the virtual bus. In one embodiment, a computing device may include an already developed hardware component that is associated with the software. In one embodiment, a virtual hardware component provision unit may provide a plurality of virtual hardware components. In one embodiment, a software test unit may be further configured to test software in parallel based on behaviors simulated by a plurality of virtual hardware components. In one embodiment, a simulated behavior of a hardware component may include at least one of a normal behavior and an error behavior of the hardware component.

It should be appreciated through the following description that according to the embodiments of the present disclosure, software test is performed by providing virtual hardware components that may simulate behaviors of the actual hardware components. In certain embodiment, such software test method may enable software development and hardware development to be executed in parallel, and different software to be tested for different hardware components may be tested in parallel, which facilitates a progress of the software development and shortens the time consumed for product development. In certain other embodiment, because it may be unnecessary to manufacture, deliver, and maintain hardware engineering boards for software testing purpose, this method may be a cost-effective. In certain other embodiments, additionally, virtual hardware components may not only simulate normal behaviors of hardware components, but may also simulate error behaviors of hardware components, thereby effectively testing a processing capability of software errors and enhancing robustness of the software.

Reference is made to FIG. 1, which shows an exemplary flowchart of a method for software test 100 according to an embodiment of the present disclosure. It should be appreciated that method 100 may further comprise additional steps and/or omit execution of some shown steps. The scope of the present invention is not limited in this regard.

At step S101 of method 100, at least one virtual hardware component is provided by a computing device, each virtual hardware component simulating a behavior of a hardware component associated with a to-be-tested software. At step S102 of method 100, the to-be-tested software is tested based on a behavior simulated by at least one virtual hardware component.

In one embodiment, in order to facilitate a progress of software development and shorten time consumed for overall product development, a hardware simulation platform may be provided, that may be enabled on a computing device. In a further embodiment, as an example, a platform may be implemented based on a virtual machine infrastructure (e.g., using a virtualization tool QEMU). In a further embodiment, in order to provide a virtual hardware component, a computing device may have at least a central processing unit (CPU) and a memory. In a further embodiment, a computing device may also include other essential components. In a further embodiment, a computing device may be any of a desktop computer, a portable computer, a laptop computer, a portable device, a cellular phone, a smart phone, a personal digital assistant, and any other suitable device having a processing capability.

In one embodiment, virtual hardware components provided may simulate behaviors of hardware components associated with a to-be-tested software. In one example embodiment, software may have one associated hardware component. In other examples embodiments, software may have a plurality of associated hardware components.

As used in the embodiments herein, a "hardware component" may include any hardware component that may provide a class of functions of a hardware product (e.g., electronic device, electronic apparatus, or server, etc.) and may require support from corresponding software. In one embodiment, for example, a hardware component may include, but not limited to, an input/output (I/O) device, a small I/O card (SLiC), a baseboard management controller (BMC), a control and monitor device (CMD), a power source (PS), a local area network (LAN) access device, a platform management chip set, a fan, a hard disk driver, etc.

Further, in one embodiment, a hardware components associated with a to-be-tested software may further include a CPU and a memory. In this embodiment, a computing device having a suitable CPU and a memory may be selected based on requirements of a being developed product on a CPU and memory, so that it may perform better software tests subsequently.

In one embodiment, during a product development process, standards and interfaces of hardware components may be selected and designs of their functions may be predefined. In a further embodiment, based on such predefined information, virtual hardware components may simulate behaviors of actual hardware components. In an example embodiment, a virtual I/O device may simulate input operations, output operations and the like of an actual I/O device selected by a hardware product to which to-be-tested software is to be applied.

In one embodiment, simulation of a virtual hardware component with respect to a behavior of an actual hardware component may be implemented based on software programming In a further embodiment simulation of a virtual hardware component with respect to a behavior of an actual hardware component may be flexibly implemented in a software manner. In some embodiments, a plurality of virtual hardware components corresponding to one actual hardware component may be simulated on one computing device. In some other embodiments, a plurality of virtual hardware components that may be corresponding to a plurality of actual hardware components respectively may be simulated out on one computing device. In some other embodiment, a number of virtual hardware components simulated on one computing device may depend on actual testing requirements and may be flexibly implemented by software programming.

In one embodiment, in addition to providing virtual hardware components on a hardware simulation platform of a computing device, there may be also provided a virtual bus corresponding to virtual hardware components, such that virtual hardware components may be connected to a central processor and a memory in a computing device via a virtual bus. In a further embodiment, this may also be simulation of bus connections of actual hardware components to a central processor and a memory. In some embodiments, various hardware components may be connected to a central processor and a memory in a hardware product via a peripheral component interconnect (PCI) bus, a PCI-Express bus, an inter-integrated circuit (I2C) bus, or a universal serial bus (USB), etc. In some other embodiments, a virtual bus may be provided according to a standard of a corresponding bus for connecting a hardware component. In some other embodiments, a hardware simulation platform, virtual hardware components may be connected to a central processor and a memory via their respective corresponding virtual buses. In some other embodiments, through connections of virtual buses, an overall environment of a hardware product to which to-be-tested software may be applied can be better simulated.

In one embodiment, test of software may be performed on a basis of virtual hardware components. In a further embodiment, since virtual hardware components may simulate behaviors of actual hardware components, software may be debugged based on these behaviors so as to find errors in the software, verify functions of the software, and perform other aspects involved in the software test. In a further embodiment, specifically behaviors that may be required to be simulated for testing software may depend on a design of the software developers. In some example embodiments, a hardware simulation platform may simulate as many behaviors as possible of corresponding actual hardware components so as to be available for software developers to select in a software test.

In one embodiment, a behavior simulated by a virtual hardware component may include at least one of a normal behavior and an error behavior of an actual hardware component. In a further embodiment, a normal behavior of an actual hardware component may refer to an operation, response, or other behaviors that may be performed by a hardware component during normal execution. In a further embodiment, an error behavior of an actual hardware component may refer to behaviors such as operation and response which may be performed by a hardware component in case of failure. In a further embodiment, for software test performed using a hardware engineering board finished by a hardware development department, software usually may only be tested when a hardware component operates normally. In some embodiments, behaviors of actual hardware components may be simulated by virtual hardware components, which virtual hardware components may not only simulate normal behaviors of actual hardware components, but also flexibly simulate error behaviors so as to test the software. In some other embodiment, a software test process may be provided that may effectively test processing capability of a software error and enhance robustness of the software.

In one embodiment, if a potential defect (e.g., improper hardware model, improper function selection, etc.) of the currently simulated hardware component may be found during a process of performing software test using virtual hardware components, such defect may also be fed back to a hardware development department so as to facilitate hardware development.

In one embodiment, simulation of virtual hardware components with respect to behaviors of actual hardware components may be flexibly implemented by software programming. In a further embodiment, a plurality of virtual hardware components for testing certain software may be provided on a computing device, or a plurality of virtual hardware components for testing a plurality of pieces of software may be provided in parallel. In a further embodiment, (a plurality of pieces of) software may be tested in parallel based on behavior of a plurality of virtual hardware components. In an example embodiment, different aspects of software may be tested in parallel using a plurality of identical virtual hardware components, or a plurality of pieces of software may be tested in parallel using corresponding virtual hardware components in parallel. In a further embodiment, parallel executions of software test may effectively shorten time consumed for software tests. In a further embodiment, parallel executions of software test may also reduce a need of actual hardware (e.g., computing devices), thereby reducing economic costs (e.g., hardware purchase cost, hardware maintenance cost, hardware power consumption cost, etc.).

In one embodiment, a hardware component associated with to-be-tested software may also include a CPU and a memory. In a further embodiment, since a CPU and a memory may physically exist in a computing device that provides virtual hardware components, if only one memory and/or one processor are needed during the process of software test, the software test may be performed directly using the CPU and memory physically existing on the computing device. In some embodiments, in order to perform software test in parallel in one computing device (e.g., in order to test different functions and aspects of the software, or test different software in parallel), a CPU may also be virtualized into a plurality of virtual CPUs and a memory may be virtualized into a plurality of virtual memories.

In one embodiment, a limited number of hardware engineering boards may already be manufactured during a certain stage of a hardware development. In a further embodiment, hardware engineering boards may have one or more hardware components needed by a hardware product that may be developed. casein a further embodiment, a previously described computing device that is providing a virtual hardware component may be a hardware engineering board, which includes actual hardware components that may be already developed and associated with a to-be-tested software. In a further embodiment, an operating hardware simulation platform may also be operated on an already developed hardware engineering board, so as to virtualize one actual hardware component on a hardware engineering board into a plurality of virtual hardware components. In a further embodiment, software tests may be executed based on a plurality of virtual hardware components. In a further embodiment, a limited number of hardware engineering boards may satisfy the needs of the software tests.

Figure 2:
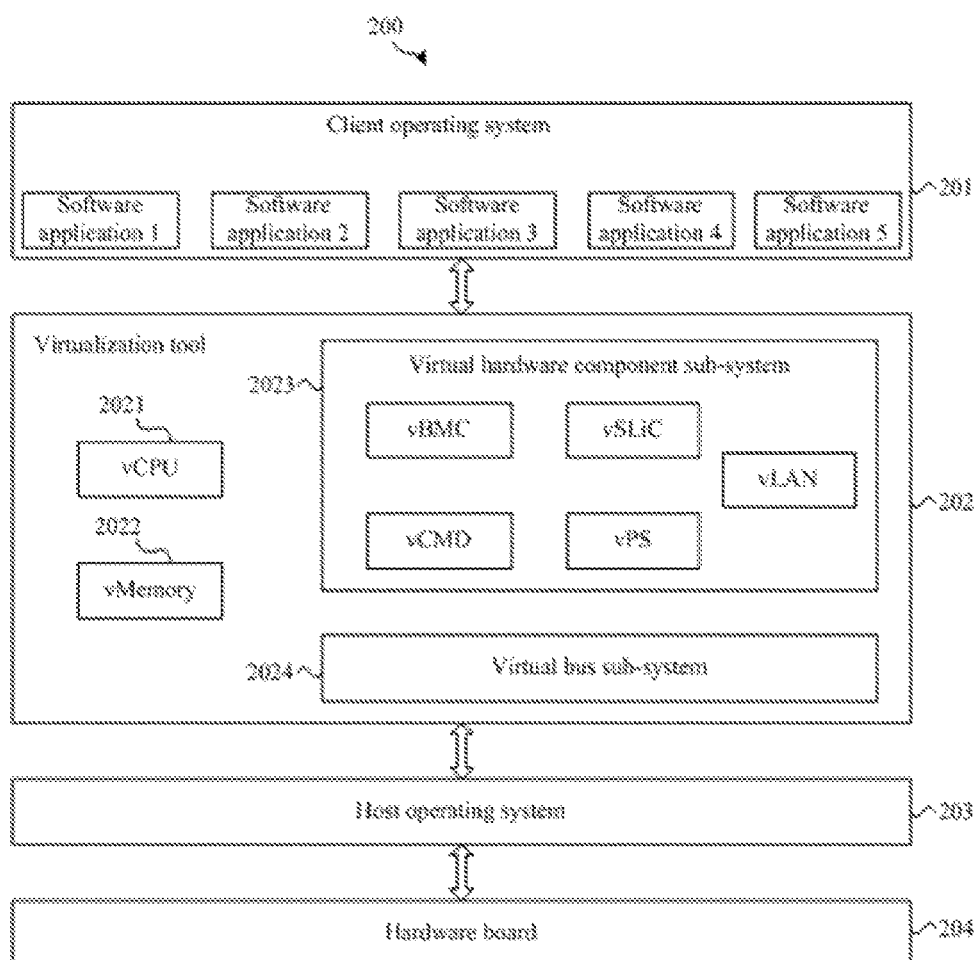
FIG. 2 shows an exemplary schematic diagram of a hardware simulation platform for software test according to an embodiment of the present invention.

FIG. 2 shows an exemplary schematic diagram of a hardware simulation platform 200 for software test according to an embodiment of the present invention. Hardware simulation platform 200 may be based on virtual machine architecture, and may include client operating system 201, virtualization tool 202, host operating system 203, and hardware board 204. Host operating system 203 and hardware board 204 are fundamental components of the virtual machine architecture. Virtualization tool 202 provides implementation of virtual hardware components. Virtualization tool 202 includes virtual central processing unit 2021 vCPU and a virtual memory 2022 vMemory. Virtualization tool 202 further includes virtual hardware component sub-system 2023. Virtual hardware component sub-system 2023 provides one or more virtual hardware components, e.g., the illustrated five virtual hardware components, vMBC, vCMD, vSLiC, vPS, and vLAN. These virtual hardware components simulate behaviors of an actual hardware components BMC, CMD, SLiC, PS, and LAN, respectively. Virtual bus sub-system 2024 included in the virtualized tool 202 provides a bus connection of virtual hardware component sub-system 2023 to virtual processor 2021 and virtual memory 2022. In some examples, virtual bus sub-system 2024 may provide a corresponding virtual bus, such as a virtualized PCI bus, a PCIE bus, an I2C bus, a USB bus and the like, based on the connected virtual hardware components. Client operating system 201 in hardware simulation platform 200 may be operated by software developers to perform software tests, e.g., to test software applications 1 to 5. The behaviors simulated using the virtual hardware components vBMC, vCMD, vSLiC, vPS, and vLAN may be used to test the software applications 1 to 5, respectively.

It should be noted that the hardware simulation platform in FIG. 2 is illustrated merely for illustration purpose, rather than limiting the scope of the present disclosure. In some embodiments, some devices may be added or deduced dependent on specific situations. In an example embodiment, virtual hardware component sub-system 2023 may virtualize more or less virtual hardware components than those illustrated in FIG. 2. In a further embodiment, client operating system 201 may be used to test more or less software applications than those illustrated in FIG. 2.

Figure 3:
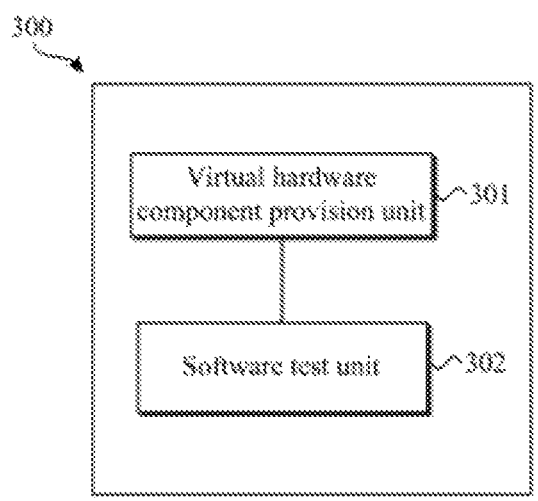
FIG. 3 shows an exemplary block diagram of a computing device for software test according to an embodiment of the present invention.

FIG. 3 illustrates an exemplary block diagram of a computing device for software test 300 according to an embodiment of the present invention. As shown in FIG. 3, computing device 300 comprises virtual hardware component provision unit 301 configured to provide at least one virtual hardware component, each virtual hardware component simulating a behavior of a hardware component associated with to-be-tested software. The computing device further comprises software test unit 302 configured to test a to-be-tested software based on the behavior simulated by the at least one virtual hardware component.

In one embodiment of the present invention, computing device 300 has at least a central processor and a memory. In one embodiment, computing device 300 further comprises a virtual bus provision unit configured to provide a virtual bus corresponding to at least one virtual hardware component, such that the at least one virtual hardware component may be connected to a central processor and a memory via the virtual bus.

In one embodiment, computing device 300 may include an already developed hardware component associated with the software. In one embodiment, virtual hardware component provision unit 301 may provide a plurality of virtual hardware components. In one embodiment, software test unit 302 may be further configured to test software in parallel based on the behaviors simulated by a plurality of virtual hardware components. In one embodiment, a simulated behavior of a hardware component may include at least one of a normal behavior and an error behavior of the hardware component.

It should be noted that for the sake of clarity, FIG. 3 does not show optional units or sub-units included in computing device 300. In some embodiments, all features and operations as described above are suitable for computing device 300, respectively. Moreover, partitioning of units or sub-units in computing device 300 is exemplary, rather than being limitative, which is intended to describe their main functions or operations logically. In some embodiments, a function of one unit may be implemented by a plurality of other units; and on the contrary, a plurality of units may be implemented by one unit.

In some embodiments, units included in computing device 300 may be implemented by various manners, including software, hardware, firmware, and any combination thereof. For example, in some embodiments, computing device 300 may be implemented by software and/or firmware. In some alternate or additional embodiments, computing device 300 may be implemented partially or completely based on hardware. For example, in some embodiments, one or more units in computing device 300 may be implemented as an integrated circuit (IC) chip, an application specific integrated circuit (ASIC), a system on chip (SOC), a field programmable gate array (FPGA) and the like.

Hereinafter, reference is made to FIG. 4, in which an exemplary schematic block diagram of a computer system 400 suitable for implementing embodiments of the present disclosure is shown. For example, computer system 400 as shown in FIG. 4 may be used to implement various parts of the computing device for software test 300 as described above, or to solidify or implement various steps of the method for software test 100 as described above.

Figure 4:
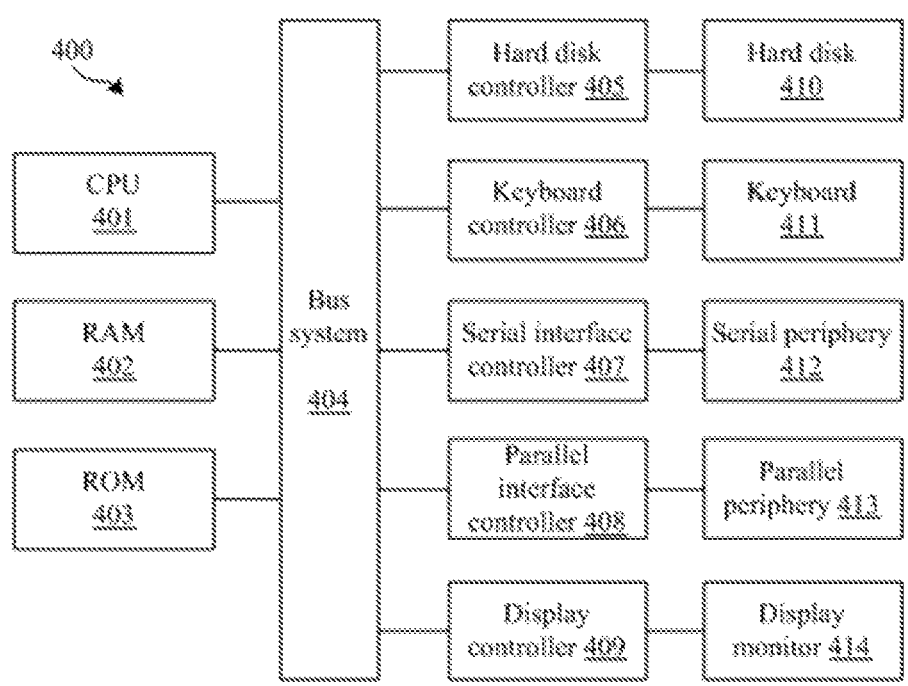
FIG. 4 shows an exemplary schematic block diagram of a computer system suitable for implementing embodiments of the present invention.

As illustrated in FIG. 4, the computer system comprises: CPU (Central Processing Unit) 401, RAM (Random Access Memory) 402, ROM (Read Only Memory) 403, system bus 404, hard disk controller 405, keyboard controller 406, serial interface controller 407, parallel interface controller 408, display controller 409, hard disk 410, keyboard 411, serial peripheral device 412, parallel peripheral device 413, and display monitor 414. Among these components, coupled to system bus 404 are CPU 401, RAM 402, ROM 403, hard disk controller 405, keyboard controller 406, serial interface controller 407, parallel controller 408, and display controller 409. Hard disk 410 is coupled to hard disk controller 405; keyboard 411 is coupled to keyboard controller 406; serial peripheral device 412 is coupled to serial interface controller 407; parallel peripheral device 413 is coupled to parallel interface controller 408; and monitor 414 is coupled to monitor controller 409. It should be understood that the structural block diagram in FIG. 4 is illustrated merely for illustration purpose, and is not intended to limit the scope of the invention. In some cases, some devices can be added or reduced as required.

As mentioned above, computing device 300 may be implemented as pure hardware, e.g., a chip, ASIC, SOC, etc. Such hardware may be integrated in computer system 400. Besides, embodiments of the present disclosure may also be implemented in the form of a computer program product. For example, method 100 described with reference to FIG. 1 may be implemented through a computer program product. Computer program product may be stored in RAM 404, ROM 404, hard disk 410 as shown in FIG. 4 and/or any suitable storage medium, or may be downloaded onto computer system 400 from an appropriate address via the network. The computer product may also include a portion of computer codes which includes program instructions executable by a suitable processing device (e.g., CPU 401 as shown in FIG. 4). The program instructions may include at least instructions for implementing steps of method 100. These instructions may for example include: instructions for determining a context where the firm is located, instructions for determining a hardware environment where the firm is located, and instructions for testing the firm at least in part based on the context and the hardware environment.

It should be noted that embodiments of the present disclosure may be implemented through hardware, software, or a combination of software and hardware. The hardware portion may be implemented through a dedicated logic; the software portion may be stored in a memory and executed by a suitable instruction executing system, e.g., a microprocessor or a dedicated designed hardware. A person of normal skilled in the art may understand that the above device and method may be implemented using computer executable instructions and/or instruction included in processor control codes; for example, such codes are provided on a carrier medium such as disk, CD or DVD-ROM, a programmable memory such as read-only memory (firmware), or data carrier such as optical or electronic signal carrier. The device according to embodiments of the present disclosure, as well as its modules, may be implemented by hardware circuit such as a very large-scale integrated circuit or gate array, a semiconductor such as logic chip, transistor, etc., or a programmable hardware device such as field programmable gate array, a programmable logic device, etc., or may be implemented by software executed by various kinds of processors, or implemented by a combination of the above hardware circuit and software, e.g., firmware.

It should be noted that although a plurality of modules and sub-modules of the device have been mentioned in the above detailed description, such dividing is only non-compulsory. Actually, according to embodiments of the present disclosure, features and functions of the above described two or more modules may be instantiated in one module. On the contrary, features and functions of one module described above may be further divided into a plurality of modules to instantiate.

Furthermore, although operations of the method of the present disclosure have been described at a particular sequence in the drawings, it does not require or suggest that these operations must be executed according to this particular sequence, or a desired result can only be achieved by performing all of the shown operations. On the contrary, the steps depicted in the flowchart may change the execution sequence. Additionally or alternatively, some steps may be omitted; a plurality of steps may be reduced to one step for execution; and/or one step may be decomposed into a plurality of steps for execution.

Although the present disclosure has been described with reference to a plurality of preferred embodiments, it should be understood that the present disclosure is not limited to the disclosed preferred embodiments. The present disclosure intends to cover various modifications and equivalent arrangements included within the spirit and scope of the appended claims. The scope of the appended claims conforms to the broadest explanation, thereby covering all such modifications and equivalent structures and functions.

What is claimed is:

1. A method for software test, the method comprising:
providing, by a computing device, at least one virtual hardware component, each virtual hardware component simulating a behavior of a hardware component associated with a to-be-tested software; and
testing the to-be-tested software based on the behavior simulated by the at least one virtual hardware component;
wherein multiple instances of the to-be-tested software is enabled to be tested using multiple instances of the virtual hardware component;
testing multiple instances of the to-be-tested software in parallel based on the behavior simulated by the plurality of virtual hardware components;
wherein the simulated behavior of the hardware component includes at least one of a normal behavior and an error behavior of the hardware component.

2. The method according to claim 1, wherein the computing device has at least a central processor and a memory.

3. The method according to claim 2, further comprising:
providing, by a computing device, a virtual bus corresponding to the at least one virtual hardware component, wherein the at least one virtual hardware component is coupled to the central processor and the memory via the virtual bus.

4. The method according to claim 1, wherein the computing device includes an already developed hardware component that is associated with the to-be-tested software.

5. The method according to claim 4, wherein a plurality of virtual hardware components are provided by the computing device.

6. A computing device for software test, configured to provide at least one virtual hardware component, each virtual hardware component simulating a behavior of a hardware component associated with a to-be-tested software; and
test the to-be-tested software based on the behavior simulated by the at least one virtual hardware component
wherein multiple instances of the to-be-tested software is enabled to be tested using multiple instances of the virtual hardware component provided by the computing device;
testing multiple instances of the to-be-tested software in parallel based on the behaviors simulated by the plurality of virtual hardware components;
wherein the simulated behavior of the hardware component includes at least one of a normal behavior and an error behavior of the hardware component.

7. The computing device according to claim 6, wherein the computing device has at least a central processor and a memory.

8. The computing device according to claim 7, configured to provide a virtual bus corresponding to the at least one virtual hardware component, wherein the at least one virtual hardware component is coupled to the central processor and the memory via the virtual bus.

9. The computing device according to claim 6, wherein the computing device includes an already developed hardware component that is associated with the to-be-tested software.

10. The computing device according claim 9, wherein the computing device provides a plurality of virtual hardware components.

11. A computer program product comprising:
a non-transitory computer readable medium encoded with computer executable program code, wherein the code enables execution across one or more processors for
providing, by a computing device, at least one virtual hardware component, each virtual hardware component simulating a behavior of a hardware component associated with a to-be-tested software; and
testing the to-be-tested software based on the behavior simulated by the at least one virtual hardware component;
wherein multiple instances of the to-be-tested software is enabled to be tested using multiple instances of the virtual hardware component;
testing multiple instances of the to-be-tested software in parallel based on the behavior simulated by the plurality of virtual hardware components;
wherein the simulated behavior of the hardware component includes at least one of a normal behavior and an error behavior of the hardware component.

12. The computer program product according to claim 11, wherein the computing device has at least a central processor and a memory.

13. The computer program product according to claim 12, further comprising:
providing, by a computing device, a virtual bus corresponding to the at least one virtual hardware component, wherein the at least one virtual hardware component is coupled to the central processor and the memory via the virtual bus.

14. The computer program product according to claim 11, wherein the computing device includes an already developed hardware component that is associated with the to-be-tested software.

15. The computer program product according to claim 14, wherein a plurality of virtual hardware components are provided by the computing device.

* * * * *